(12) United States Patent
Yang et al.

(10) Patent No.: US 6,329,232 B1
(45) Date of Patent: Dec. 11, 2001

(54) METHOD OF MANUFACTURING A SEMICONDUCTOR DEVICE

(75) Inventors: Kuk Seung Yang, Seoul; Sang Tae Chung, Sungnam-shi, both of (KR)

(73) Assignee: Hyundai Electronics Co., Ltd., Ichon (KR)

( * ) Notice: Subject to any disclaimer, the term of this patent is extended or adjusted under 35 U.S.C. 154(b) by 28 days.

(21) Appl. No.: 09/609,156

(22) Filed: Jun. 30, 2000

(30) Foreign Application Priority Data

Jun. 30, 1999 (KR) .................................................. 99-25756

(51) Int. Cl.⁷ .................................................. H01L 21/336
(52) U.S. Cl. .......................... 438/197; 438/183; 438/621; 438/643
(58) Field of Search .................................... 438/197, 256, 438/399, 239, 183, 184, 618, 621, 626, 627, 642, 643, 645

(56) References Cited

U.S. PATENT DOCUMENTS

| 5,356,833 | 10/1994 | Maniar et al. . | |
| 5,547,893 | 8/1996 | Sung . | |
| 5,716,881 | 2/1998 | Liang et al. | 428/238 |
| 5,960,270 | * 9/1999 | Misra et al. . | |
| 5,990,021 | 11/1999 | Prall et al. | 438/745 |
| 6,001,685 | 12/1999 | Kim | 438/253 |
| 6,072,221 | * 6/2000 | Hieda . | |
| 6,100,558 | * 8/2000 | Krivokapic et al. . | |
| 6,248,675 | * 6/2001 | Xiang et al. . | |
| 6,278,164 | * 8/2001 | Hieda et al. . | |

FOREIGN PATENT DOCUMENTS

| 7-94600 | 4/1995 | (JP) . |
| 10-56178 | 2/1998 | (JP) . |

\* cited by examiner

*Primary Examiner*—Tuan H. Nguyen
(74) *Attorney, Agent, or Firm*—Pennie & Edmonds LLP

(57) ABSTRACT

There is disclosed a method of manufacturing a semiconductor device capable of preventing two electrodes from being short. The method comprises the step of forming a gate pattern in which a spacer is formed on a given region of a semiconductor substrate; forming a junction region on the semiconductor substrate by impurity ion injection process; forming a first insulating film on the entire structure, and then polishing the first insulating film until the upper portion of the gate pattern is exposed, to flatten it; removing the gate pattern to expose the semiconductor substrate, and then forming a gate oxide film on the exposed semiconductor substrate; etching a given region of the first insulating film to form a contact hole exposing the junction region; forming a barrier layer and a buffer layer on the entire structure; forming a conductive layer on the entire structure so that the portion in which a contact hole and a gate will be formed can be buried, and then polishing the conductive layer to form a gate electrode and a bit line and a plug of a charge storing electrode; and forming a second insulating film on the entire structure.

13 Claims, 1 Drawing Sheet

METHOD OF MANUFACTURING A SEMICONDUCTOR DEVICE

BACKGROUND OF THE INVENTION

1. Field of the Invention

The invention relates generally to a method of manufacturing a semiconductor device. More particularly, the present invention relates to a method of manufacturing a semiconductor device by which a gate electrode and a bit line, and a plug of a charge store electrode are simultaneously formed, thus preventing two electrodes from being short.

2. Description of the Prior Art

As the integration level of the semiconductor device becomes higher, the line width of the pattern has become more narrowed. Thus, after the gate electrode is formed, a spacer is formed at the side wall of the gate electrode, so that the bit line and the charge store electrode to be formed later are not short. Then, as the line width of the circuit becomes narrowed, the size of the spacer is reduced accordingly. Due to this, the spacers at the side wall of the neighboring gate electrodes can be short each other. Also it will cause a lot of problems when a subsequent insulating film is formed and then etched to form a contact hole, and the contact hole is buried to form a bit line or a charge store electrode. Thus, the conventional method will degrade reliability of the device.

SUMMARY OF THE INVENTION

It is therefore an object of the present invention to provide a method of manufacturing a semiconductor device which can solve the above problem by forming the gate electrode and the bit line, and the plug of the charge store electrode at the time.

A method of manufacturing a semiconductor device according to the present invention is characterized in that it comprises the step of forming a gate pattern in which a spacer is formed on a given region of a semiconductor substrate; forming a junction region on the semiconductor substrate by impurity ion injection process; forming a first insulating film on the entire structure, and then polishing the first insulating film until the upper portion of the gate pattern is exposed, to flatten it; removing the gate pattern to expose the semiconductor substrate, and then forming a gate oxide film on the exposed semiconductor substrate; etching a given region of the first insulating film to form a contact hole exposing the junction region; sequentially forming a barrier layer, a buffer layer and a conductive layer on the entire structure; polishing the conductive layer, the buffer layer and the barrier layer to form a gate electrode and a plug for a bit line and a plug for a charge storage electrode; and forming a second insulating film on the entire structure.

BRIEF DESCRIPTION OF THE DRAWINGS

The aforementioned aspects and other features of the present invention will be explained in the following description, taken in conjunction with the accompanying drawings, wherein.

DETAILED DESCRIPTION OF PREFERRED EMBODIMENTS

Figure 1A:
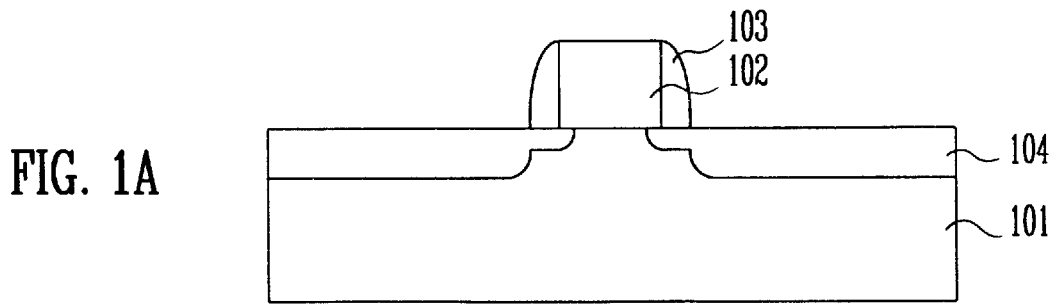
FIGS. 1A through 1D are sectional views for illustrating a method of manufacturing a semiconductor device according to the present invention.

The present invention will be described in detail by way of a preferred embodiment with reference to accompanying drawings, in which like reference numerals are used to identify the same or similar parts.

FIGS. 1A through 1D are sectional views for illustrating a method of manufacturing a semiconductor device according to the present invention.

Referring now to FIG. 1A, a gate pattern 102 is formed on a semiconductor substrate 101. The gate pattern 102 may be formed of an insulting film or a conducting film. The insulating film may employ an oxide film or a nitride film, and the conducting film may employ a poly-silicon film or a metal film. A low concentration impurity region is formed on the semiconductor substrate 101 by means of ion injection process with a low concentration impurity. Then, a spacer 103 is formed at the side wall of the gate pattern. At this time, if the gate pattern 102 is formed of a conductive film, the spacer film 103 may be formed of an insulating, but the spacer 103 may be formed of a conductive film if the gate pattern 102 is formed of an insulating film. Then, a high concentration impurity region is formed on the semiconductor substrate 101 by means of ion injection process with a high concentration impurity, thus forming a junction region 104 of a LDD structure.

Figure 1B:
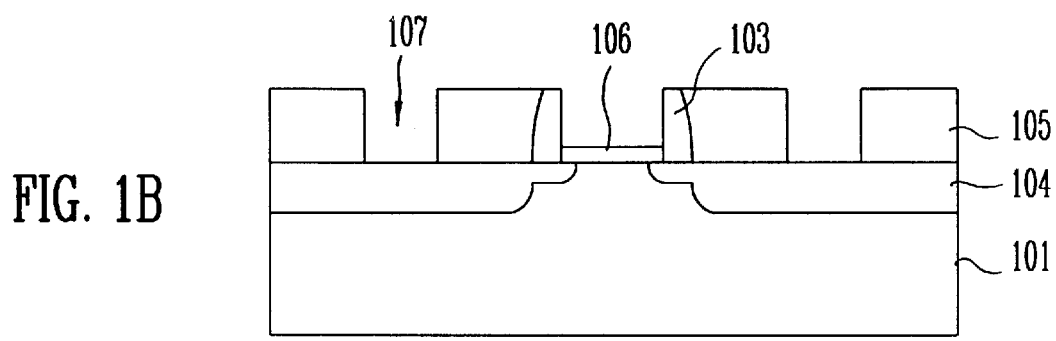

Referring to FIG. 1B, a first insulating film 105 is formed on the entire structure. Then, the insulating film is flattened by CMP process until the upper portion of the gate pattern 102 is exposed. The gate pattern 102 is removed to expose a given region of the semiconductor substrate 101. Then, a gate oxide film 106 is formed on the semiconductor substrate 101. The gate oxide film 106 may be formed of a silicon oxide film or a tantalum oxide film $Ta_2O_5$. After a photosensitive film is applied on the entire structure, a given region of the first insulating film 105 is etched by lithography process and etching process, thereby to form a contact hole 107 exposing the junction region 104. Within the contact hole 107 is formed a plug that later connects the bit line and the charge store electrode with the junction region.

Figure 1C:
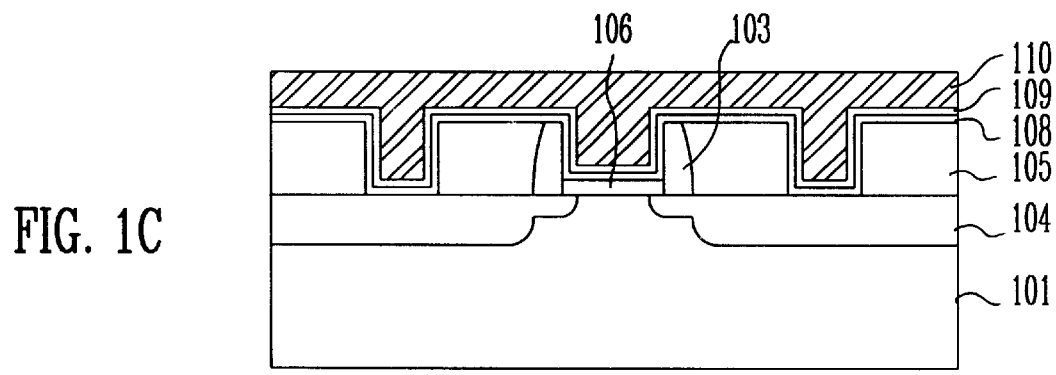

Referring now to FIG. 1C, a barrier metal layer 108 and a buffer layer 109 are thin formed on the entire structure. The buffer layer 109 is formed of amorphous silicon film in thickness of 50~200 angstrom. Thereafter, a conductive layer 110 is formed on the entire structure so that the portion in which the contact hole 107 and the gate will be formed. The conductive layer 110 is formed of a polysilicon film or a double film consisted of a polysilicon film and a metal layer.

Figure 1D:
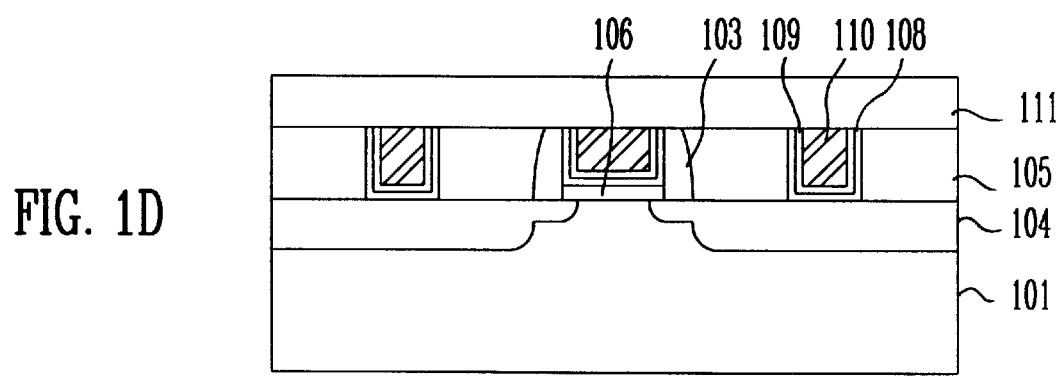

Referring to FIG. 1D, the metal layer 110, the buffer layer 109 and the barrier metal layer 108 are polished or blank etched to form the gate electrode and a plug for a bit line, and a plug for a charge storage electrode. At this time, in case of blank etch, it over-etches in about 500~2000 angstrom. Then, a second insulating film 111 is formed on the entire structure.

Alternatively, before the gate pattern is removed, a given region of the first insulating film may be etched to form a contact hole, and then the gate pattern may be removed to form a gate oxide film.

Meanwhile, alternatively, before the gate pattern is formed, the semiconductor substrate may be etched in a given depth to form a channel, and a subsequent process may be performed.

As can be understood from the above description, the present invention can form simultaneously a gate electrode and a bit line, and a plug of a charge store electrode in the process of manufacturing a high integrated semiconductor device, thus preventing the two electrodes from being shorted. Also, it enables a device of a high performance to be manufactured because it can operate the device at small voltage. Further, according to the present invention, as the step of the semiconductor substrate and the first insulating film is very small, it is advantageous to form a plug contact having a small size. Thus, it can implement more many cells in a same chip area than the conventional method.

The present invention has been described with reference to a particular embodiment in connection with a particular application. Those having ordinary skill in the art and access to the teachings of the present invention will recognize additional modifications and applications within the scope thereof It is therefore intended by the appended claims to cover any and all such applications, modifications, and embodiments within the scope of the present invention.

What is claimed is:

1. A method of manufacturing a semiconductor device, comprising the steps of:

forming a gate pattern in which a spacer is formed on a given region of a semiconductor substrate;

forming a junction region on said semiconductor substrate by impurity ion injection process;

forming a first insulating film on the entire structure, and then polishing said first insulating film until the upper portion of said gate pattern is exposed, to flatten it;

removing said gate pattern to expose said semiconductor substrate, and then forming a gate oxide film on the exposed semiconductor substrate;

etching a given region of said first insulating film to expose said junction region;

sequentially forming a barrier layer, a buffer layer and a conductive layer on the entire structure;

polishing said conductive layer, said buffer layer and said barrier layer to form a gate electrode and a plug for a bit line and a plug for a charge storage electrode; and forming a second insulating film on the entire structure.

2. The method of manufacturing a semiconductor device according to claim 1, wherein said gate pattern is formed any one of an insulating film and a conductive film.

3. The method of manufacturing a semiconductor device according to claim 2, wherein said insulating film is any one of an oxide film and a nitride film.

4. The method of manufacturing a semiconductor device according to claim 2, wherein said conductive film is any one of a polysilicon film and a metal film.

5. The method of manufacturing a semiconductor device according to claim 1, wherein said spacer is formed of a conductive film and said gate pattern is formed of an insulating film.

6. The method of manufacturing a semiconductor device according to claim 1, wherein said spacer is formed of an insulating film and said gate pattern is formed of a conductive film.

7. The method of manufacturing a semiconductor device according to claim 1, wherein said gate oxide film is formed any one of a silicon oxide film and a tantalum oxide film.

8. The method of manufacturing a semiconductor device according to claim 1, wherein said buffer layer is formed of an amorphous silicon film.

9. The method of manufacturing a semiconductor device according to claim 1, wherein said buffer layer is formed in thickness of 50~200 angstrom.

10. The method of manufacturing a semiconductor device according to claim 1, wherein said conductive layer is formed a polysilicon film.

11. The method of manufacturing a semiconductor device according to claim 1, wherein said conductive layer is formed a double film consisted of a polysilicon film and a metal layer.

12. The method of manufacturing a semiconductor device according to claim 1, further comprising the step of etching a given region of said first insulating film to form a contact hole before removing said gate pattern.

13. The method of manufacturing a semiconductor device according to claim 1, further comprising the step of etching said semiconductor substrate in a given depth before forming said gate pattern.

* * * * *